United States Patent
Guo et al.

(10) Patent No.: US 10,565,903 B2
(45) Date of Patent: Feb. 18, 2020

(54) PI SUBSTRATE, PREPARATION METHOD THEREOF AND DISPLAY DEVICE

(71) Applicant: BOE Technology Group Co., Ltd., Beijing (CN)

(72) Inventors: Yuanzheng Guo, Beijing (CN); Mingche Hsieh, Beijing (CN); Ping Song, Beijing (CN); Youwei Wang, Beijing (CN); Weinan Dai, Beijing (CN); Mingwen Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/988,096

(22) Filed: May 24, 2018

(65) Prior Publication Data
US 2019/0051222 A1    Feb. 14, 2019

(30) Foreign Application Priority Data
Aug. 11, 2017    (CN) .......................... 2017 1 0686967

(51) Int. Cl.
| | |
|---|---|
| *H01L 35/24* | (2006.01) |
| *G09F 9/30* | (2006.01) |
| *H01L 51/00* | (2006.01) |
| *G06F 1/16* | (2006.01) |

(52) U.S. Cl.
CPC .......... *G09F 9/301* (2013.01); *H01L 51/0097* (2013.01); *G06F 1/1652* (2013.01)

(58) Field of Classification Search
CPC ....... H01L 51/0097; G06F 1/00; G06F 1/1652
See application file for complete search history.

(56) References Cited

U.S. PATENT DOCUMENTS

| | | | |
|---|---|---|---|
| 2011/0124183 A1 | 5/2011 | Yasumatsu et al. | |
| 2013/0115426 A1* | 5/2013 | Fang | .................. H01L 27/1266 428/156 |
| 2017/0162825 A1 | 6/2017 | Xiao et al. | |

FOREIGN PATENT DOCUMENTS

| | | |
|---|---|---|
| CN | 102089858 A | 6/2011 |
| CN | 104362077 A | 2/2015 |
| CN | 104875462 A | 9/2015 |
| CN | 105552247 A | 5/2016 |
| CN | 106098940 A | 11/2016 |

OTHER PUBLICATIONS

First office action (with English translation) of Chinese application No. 201710686967.3 dated May 30, 2019.

* cited by examiner

*Primary Examiner* — Samuel A Gebremariam
(74) *Attorney, Agent, or Firm* — Fay Sharpe LLP

(57) ABSTRACT

There are provided a PI substrate, a preparation method thereof and a display device. The preparation method includes: forming a first separable film at an edge region of a substrate; forming a first-layer polyamic acid (PAA) film on the first separable film and the substrate; stripping the first separable film and the first-layer PAA film that covers the first separable film to expose the edge region of the substrate; and performing imidization on the first-layer PAA film on the substrate with the edge region exposed, to enable the first-layer PAA film to be transformed into a first-layer PI film, thereby avoiding uneven film thicknesses at edges of the first-layer PI substrates.

14 Claims, 5 Drawing Sheets

PI SUBSTRATE, PREPARATION METHOD THEREOF AND DISPLAY DEVICE

This application claims priority to Chinese Patent Application No. 201710686967.3, filed with the State Intellectual Property Office on Aug. 11, 2017 and titled "PI SUBSTRATE, PREPARATION METHOD THEREOF AND DISPLAY DEVICE," the entire contents of which are incorporated herein by reference.

TECHNICAL FIELD

The present disclosure relates to the technical field of displays, and in particular to a PI substrate, a preparation method thereof and a display device.

BACKGROUND

With the rapid development of flexible display technology in recent years, many display panel manufacturers have exhibited their own prototypes, and actively deployed their flexible display production lines and mass production lines simultaneously. Flexible display products have been gradually developed from a research stage to a mass production stage.

A flexible substrate is a foundation of the flexible display technology. At present, there are mainly two types of flexible substrates, i.e., a polyimide (PI) substrate with a sandwich structure, and a single-layered PI substrate. When both of the above two PI substrates are coated with PI, an uneven PI diffusion may result in a problem of uneven film thicknesses at edges of the PI substrates. Due to the uneven thickness of PI at the edges of the substrates, defects invisible to naked eyes, such as residual solvents, incomplete curing and holes, may be generated during drying and curing. These defects may be turned into defects visible to the naked eyes during the subsequent process, which affects a yield rate of the PI substrates.

SUMMARY

There are provided in the present disclosure a PI substrate, a preparation method thereof and a display device.

There is provided a method for preparing a PI substrate, including: forming a first separable film at an edge region of a substrate; forming a first-layer polyamic acid (PAA) film on the first separable film and the substrate; stripping the first separable film and the first-layer PAA film that covers the first separable film to expose the edge region of the substrate; and performing imidization on the first-layer PAA film on the substrate with the edge region exposed, to enable the first-layer PAA film to be transformed into a first-layer PI film.

Optionally, the method further includes: forming an inorganic layer at the edge region of the substrate and the first-layer PI film; forming a second separable film at the edge region; forming a second-layer PAA film on the second separable film and the inorganic layer; stripping the second separable film at the edge region and the second-layer PAA film that covers the second separable film to expose the substrate at the edge region; and performing imidization on the second-layer PAA film on the substrate with the edge region exposed, to enable the second-layer PAA film to be transformed into a second-layer PI film.

Optionally, both a thickness of the second separable film and a thickness of the inorganic layer are half of a thickness of the first-layer PI film.

Optionally, the forming the first-layer PAA film on the first separable film and the substrate includes: coating the first separable film and the substrate with a PAA film; and drying the PAA film at a high temperature, to enable the PAA film to be hardened to form the first-layer PAA film.

Optionally, a width of the first separable film is 5 mm to 20 mm.

Optionally, a width of the first separable film is 10 mm.

Optionally, the first separable film includes at least one of a metal foil and a release film.

Optionally, a material of the release film comprises at least one of polyimide and polypropylene.

There is also provided in the present disclosure a method for preparing a PI substrate, including: forming a first separable film at an edge region of a substrate; forming a first-layer PI film on the first separable film and the substrate; and stripping the first separable film and the first-layer PI film that covers the first separable film to expose the edge region of the substrate.

Optionally, the method further includes: forming an inorganic layer at the edge region of the substrate and the first-layer PI film; forming a second separable film at the edge region; forming a second-layer PI film on the second separable film and the inorganic layer; and stripping the second separable film at the edge region and the second-layer PI film that covers the second separable film to expose the edge region of the substrate.

Optionally, both a thickness of the second separable film and a thickness of the inorganic layer are half of a thickness of the first-layer PI film.

Optionally, the forming the first-layer PI film on the first separable film and the substrate includes: coating the first separable film and the substrate with a PI film; and drying the PI film at a high temperature, to enable the PI film to be hardened to form the first-layer PI film.

Optionally, a width of the first separable film is 5 mm to 20 mm.

Optionally, a width of the first separable film is 10 mm.

Optionally, the first separable film comprises at least one of a metal foil and a release film.

Optionally, a material of the release film includes at least one of polyimide and polypropylene.

There is also provided in the present disclosure a PI substrate configured to be carried on a substrate, wherein the substrate includes a central region and an edge region, and the PI substrate includes: a first-layer PI film formed in the central region of the substrate and obtained after a PAA film that covers the substrate, or a portion, located at the edge region, of a PI film is stripped.

Optionally, the PI substrate further includes: an inorganic layer, wherein the inorganic layer covers the first-layer PI film; and a second-layer PI film, wherein the second-layer PI film is formed on the inorganic layer located in the central region of the substrate.

Optionally, a thickness of the inorganic layer is half of a thickness of the first-layer PI film.

There is also provided a display device, including the PI substrate mentioned above.

DETAILED DESCRIPTION

The present disclosure will be described in further detail with reference to the enclosed drawings and the specific embodiments, so as to clearly present the principles and advantages of the present disclosure.

Figure 1:
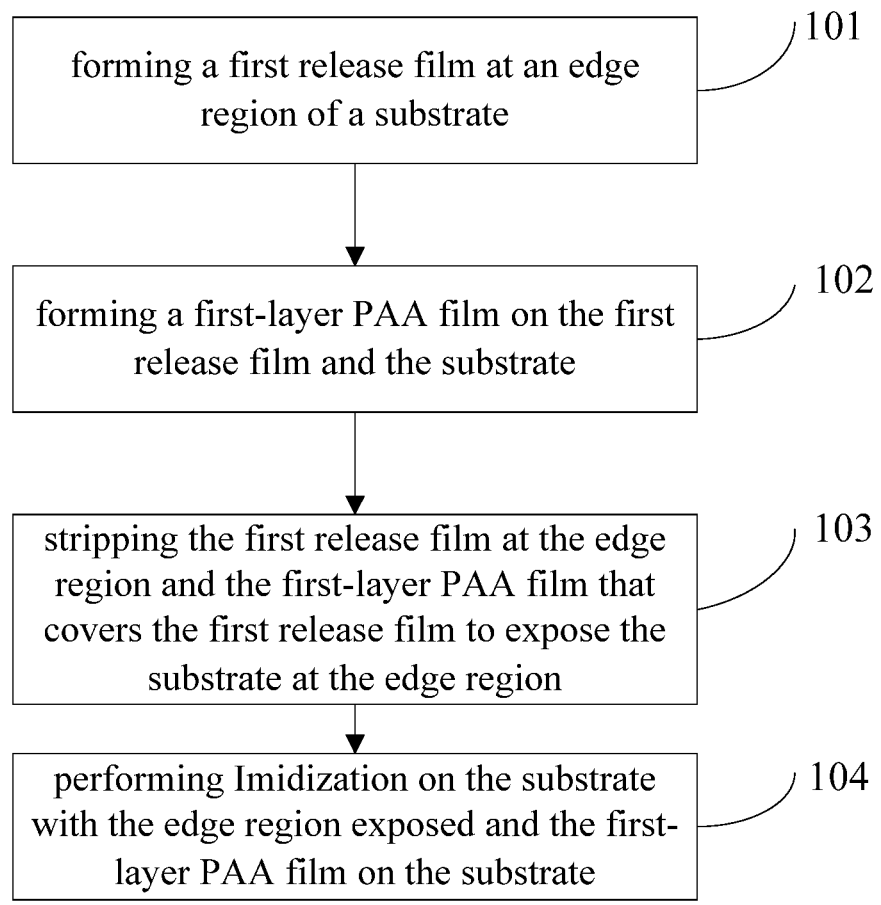
FIG. 1 is a flow chart of a method for preparing a PI substrate provided by an embodiment of the present disclosure.

Referring to FIG. 1, which shows a flow chart of a method for preparing a PI substrate provided by an embodiment of the present disclosure, the preparation method includes the following steps: forming a first release film at an edge region of a substrate in step 101.

Figure 2:
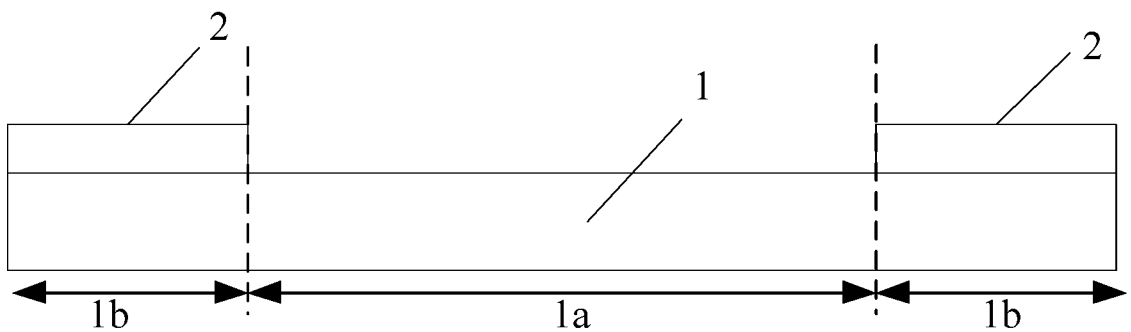
FIG. 2 is a schematic diagram of a structure of a substrate after a first release film is formed according to the present disclosure.

FIG. 2 is a schematic diagram of a structure of a substrate after a first release film is formed according to the present disclosure. As shown in FIG. 2, a substrate 1 includes a central region 1a and an edge region 1b surrounding the central region 1a. A first release film 2 is formed at the edge region 1b of the substrate 1, and may be made of an adhesive material with a low adhesion force. The adhesive material may be capable of resisting an erosion of an N-methyl-2-pyrrolidone (NMP) solvent and have a heat-resistant stability of 100° C. or above. As a solvent of a polyamic acid (PAA) solution is NMP, the PAA film may be formed on the first release film in the subsequent PAA film coating process. Thus, the first release film needs NMP resistance, so as to prevent the first release film from swelling and dissolution which may lead to a deformation. And during a subsequent PAA film hardening process, a high temperature of 80-100 □ is required to harden the PAA film, thus the first release film needs to have a certain heat-resistance, so as to avoid a shrinkage distortion during heating.

It should be noted that in the present embodiment, the first release film is adopted as a first separable film to be adhered to the edge region of the substrate. In other embodiments, a metal foil may replace the first release film to serve as the first separable film. In an implementation, the metal foil may be adhered to the edge region of the substrate 1 by means of the adhesive material. In order to facilitate a separation of the metal foil from the substrate, the adhesive material may be an adhesive material with a low adhesion force, for example, an organosilicone adhesive material. Meanwhile, the adhesive material is also capable of resisting an erosion of the NMP solvent, and to have a heat-resistance stability of 100 □ or above. In addition, since a metal material itself may also be capable of resisting an erosion of the NMP solvent and has a heat-resistance stability of 100 □ or above, the metal foil may also serve as the first separable film.

Moreover, the first separable film may be formed on the substrate by other means, such as coating, sputtering, evaporation and etc., in addition to being adhered onto the substrate, as long as an adhesion force between the first separable film and the substrate is less than an adhesion force between the first separable film and a PI layer.

Optionally, the substrate may be formed of a transparent glass material with a main component thereof being silicon dioxide. The material for forming the substrate is not limited to the transparent glass material, but may also be a transparent plastic material. That is, the substrate may be either a glass substrate or a plastic substrate. Of course, the substrate may also be other rigid substrates, such as a silicon substrate, a metal substrate and so on.

Exemplarily, a shape of the edge region may be set according to a shape of the substrate 1, for example, along an outline of the substrate 1. A shape of the substrate 1 includes, but is not limited to, a more common rectangle, and may also be other shapes, such as a polygon, a circle, and so on.

As shown again in FIG. 1, a first-layer PAA film is formed on the first release film and the substrate in step 102.

Figure 3:
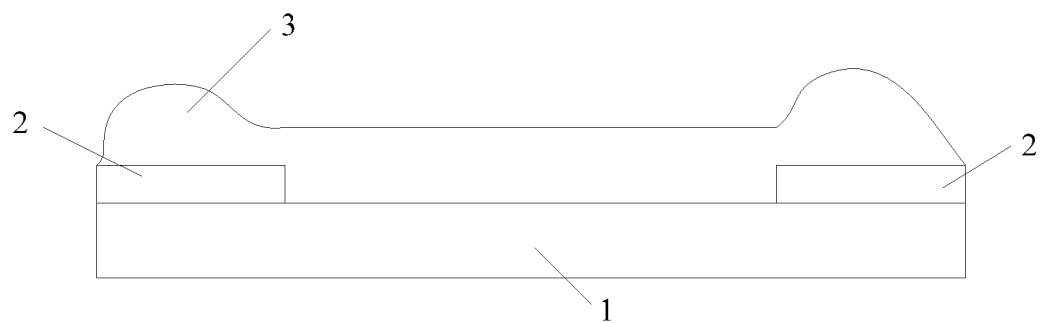
FIG. 3 is a schematic diagram of a structure of a first-layer PAA film formed in the present disclosure.

As shown in FIG. 3, the first-layer polyamic acid (PAA) film 3 is formed on the first release film 2 and the substrate 1.

For example, the substrate 1 may be coated with a layer of the PAA solution. Then, the solvent in the PAA solution may be evaporated (for example, 80% or more of the solvent may be evaporated), such that a film layer can be hardened, and the first-layer PAA film can be obtained.

As shown again in FIG. 1, the first release film at the edge region and the first-layer PAA film that covers the first release film are stripped to expose the substrate at the edge region in step 103.

Figure 4:
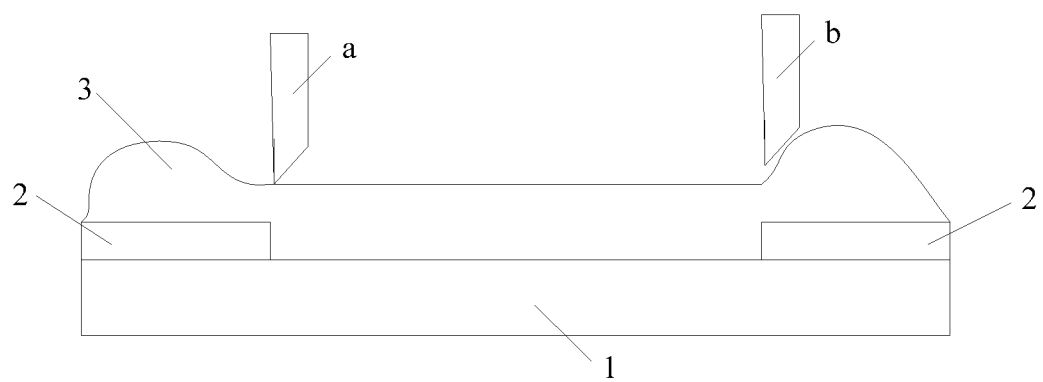
FIG. 4 is a schematic diagram of a structure in which a first-layer PAA film and a first release film are stripped according to the present disclosure.

As shown in FIG. 4, the first release film 2 and the first-layer PAA film 3 that covers the first release film 2 are stripped to expose the substrate 1 at the edge region 1b.

The step 103 may be performed in the following way: a linear cutter can be moved downwards for cutting along an inner edge of the first release film 2 from a surface of the first-layer PAA film 3 away from the substrate 1, and then the first release film 2 and the first-layer PAA film 3 can be stripped, such that an region with uneven thicknesses at the edge of PI is stripped, and the substrate 1 at the edge region 1b is exposed. The linear cutter may be a metal wire or the like. Of course, other tools for linear cutting, such as a laser cutting tool, may also be employed.

Exemplarily, as shown in FIG. 4, on completion of the above-described step 102, a cutting removal operation is performed. For example, the linear cutters a and b in FIG. 4 respectively indicate downward movements along the inner edge of the first release film 2 for cutting. After that, the first release film 2 and the first-layer PAA film are stripped, such that the region with the uneven thicknesses at the edge of PI may be stripped to expose the substrate at the edge region. That is, the first release film and the first-layer PAA film are successfully separated from the substrate.

As shown again in FIG. 1, imidization is performed on the substrate with the edge region exposed and the first-layer PAA film on the substrate to form a PI substrate in step 104.

Figure 5:
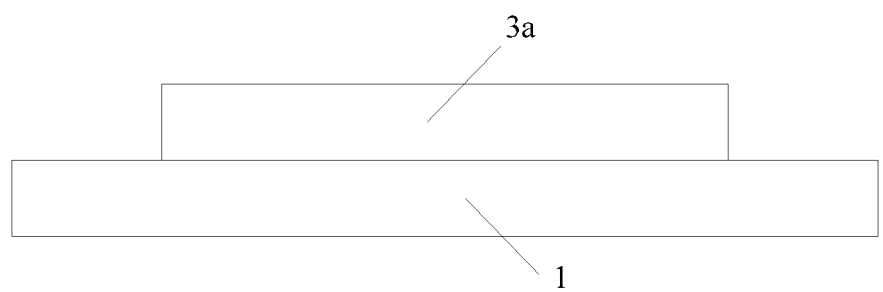
FIG. 5 is a schematic diagram of a structure of a PI substrate provided by the present disclosure.

As shown in FIG. 5, after the imidization, the first-layer PAA film 3 is transformed into a first-layer PI film 3a.

It should be noted that alternatively, a PI film may also be formed on the first release film and the substrate. Then, the first release film at the edge region and the PI film that covers the first release film are stripped to expose the substrate at the edge region. The substrate with the edge region exposed and the PI film on the substrate are heated at a high temperature, such that the PI film is hardened to form a first-layer PI film, so as to form a PI substrate. That is, if the substrate is directly coated with a PI film, the first-layer PI film can be obtained by simply hardening the PI film, and no imidization is required.

In the present embodiment, the PI substrate can be formed by forming the first release film at the edge region of the substrate, forming the first-layer PAA film on the first release film and the substrate, stripping the first release film at the edge region and the first-layer PAA film that covers the first release film to expose the edge region of the substrate, and performing the imidization on the substrate with the edge region exposed and the first-layer PAA film on the substrate. Since the first release film and the first-layer PAA film at the edge region are cut and stripped, that is, a region with uneven thicknesses at the edge region of the PI substrate is cut, thus there is no edge region with uneven thicknesses on the formed PI substrate, thereby eliminating the problem of uneven thicknesses of the PI film at the edge region during PI coating, and improving the yield of the PI substrate at the same time.

Figure 6:
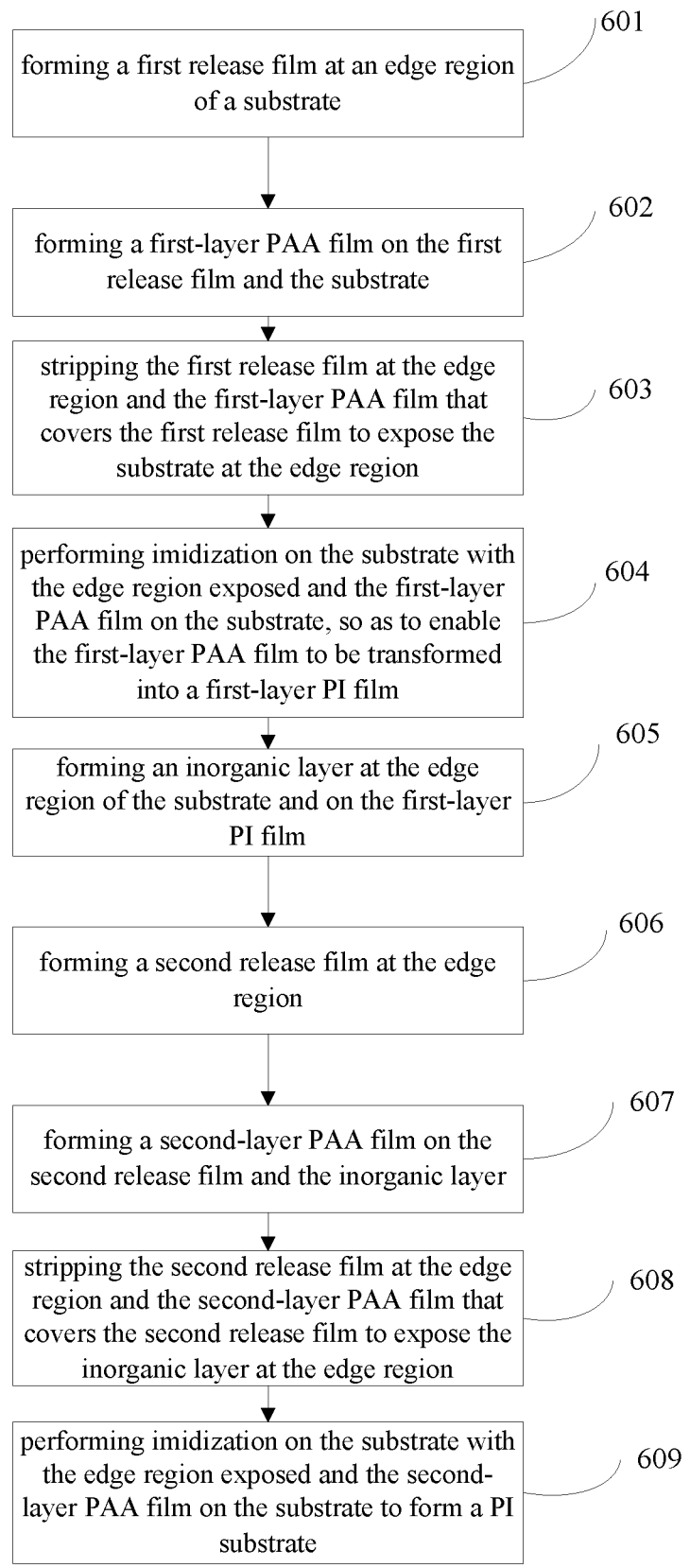
FIG. 6 is a flow chart of a method for preparing a PI substrate provided by an embodiment of the present disclosure.

Referring to FIG. 6, it shows a flow chart of another method for preparing a PI substrate provided by an embodiment of the present disclosure, including the following steps: forming a first release film at an edge region of a substrate in step 601.

The first release film may be made of an adhesive material with a low adhesion force. The adhesive material may be capable of resisting an erosion of an N-methyl-pyrrolidone (NMP) solvent and have a heat-resistant stability of 100 □ or above. Since polyimide and polypropylene have characteristics of erosion resistance, reaction resistance and the like, the first release film may be made of at least one of polyimide and polypropylene.

A width of the first release film may be set according to actual needs, and generally may be 5 mm to 20 mm, which is not specifically limited by the present disclosure. For example, the width of the first release film may be 10 mm.

As shown in FIG. 6, a first-layer PAA film is formed on the first release film and the substrate in step 602.

The step 602 may include: coating the first release film and the substrate with the PAA film; and drying the PAA film at a high temperature, so as to harden the PAA film to form the first-layer PAA film.

Optionally, a PI coater can be used to coat the first release film and the substrate with the PAA film, and vacuum drying equipment or a hot plate can be used to process the coating PAA film, so as to remove the solution in the PAA film, and harden the PAA film to form the first-layer PAA film.

As shown again in FIG. 6, the first release film at the edge region and the first-layer PAA film that covers the first release film are stripped to expose the substrate at the edge region in step 603;

imidization is performed on the substrate with the edge region exposed and the first-layer PAA film on the substrate, so as to enable the first-layer PAA film to be transformed into a first-layer PI film in step 604.

Since the surface of the substrate with the edge region exposed and the first-layer PAA film on the substrate are rough, imidization is performed and realized in a way of heating the substrate with the edge region exposed and the first-layer PAA film on the substrate up to 200-500 □, so as to enable the first-layer PAA film to be transformed into the first-layer PI film.

Further, an inorganic layer is formed at the edge region of the substrate and on the first-layer PI film in step 605.

Figure 7:
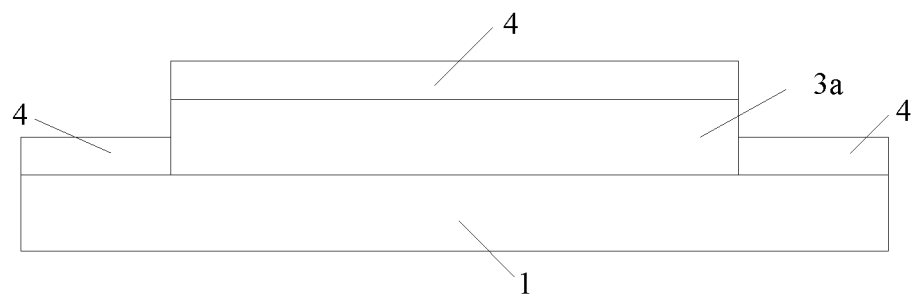
FIG. 7 is a schematic diagram of a structure of an inorganic layer formed in the present disclosure.

As shown in FIG. 7, the inorganic layer 4 is formed at the edge region 1b of the substrate 1 and the first-layer PI film 3a.

The inorganic layer may be a composite material of polyester resin, which is not specifically limited in the present disclosure.

As an example, the inorganic layer may be formed by using PECVD (Plasma Enhanced Chemical Vapor Deposition).

As shown again in FIG. 6, a second release film is formed at the edge region in step 606.

Figure 8:
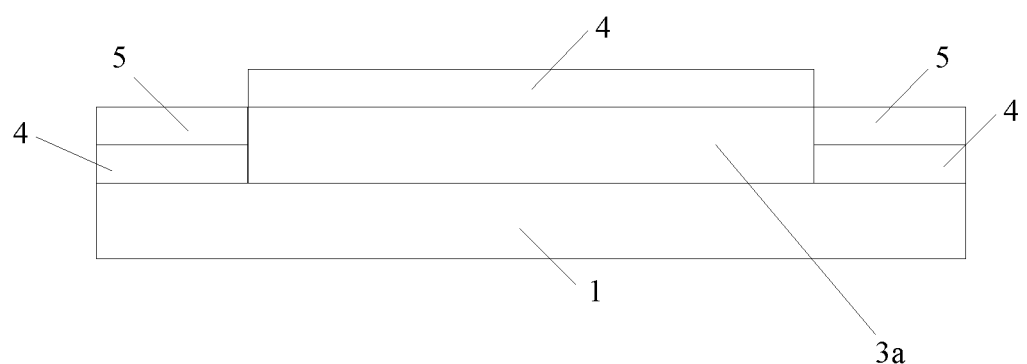
FIG. 8 is a schematic diagram of a structure of a second release film formed in the present disclosure.

As shown in FIG. 8, the second release film 5 is formed on the inorganic layer 4 of the edge region 1b.

The second release film may be made of an adhesive material with a low adhesion force. The adhesive material may be capable of resisting an erosion of an N-methyl-2-pyrrolidone (NMP) solvent and have a heat-resistant stability of 100 □ or above. Exemplarily, the second release film may be made of at least one of polyimide and polypropylene.

A width of the second release film may be set according to actual needs, and generally may be 5 mm to 20 mm, which is not specifically limited by the present disclosure. For example, the width of the second release film may be 10 mm. That is, the width of the edge region of the substrate may also be 10 mm.

Optionally, a thickness of the second release film 5 and a thickness of the inorganic layer 4 are respectively half of a thickness of the first-layer PI film 3a. In practice, the thicknesses of the second release film and the inorganic layer are as thin as possible, so as to avoid interfering a formation of a second-layer PAA film. Meanwhile, the small thicknesses of the inorganic layer and the second release film can make the inorganic layers at the edge region and at a central region to separate from each other. In the subsequent process of separating the PI substrate from the substrate 1, due to a strong adhesion force between the inorganic layer and the substrate 1, both the inorganic layer 4 at the edge region and the substrate 1 may be separated from the PI substrate. Exemplarily, the thickness of the second release film may be 1,000 Å to 20 μm, and the thickness of the inorganic layer may be 1,000 Å to 10,000 Å.

When a thickness of the second release film 5 and a thickness of the inorganic layer 4 are respectively half of a thickness of the first-layer PI film, the surface (away from the substrate 1) of the second release film 5 and the surface (away from the substrate 1) of the first-layer PI film at the central region of the substrate may be located on the same plane.

As shown again in FIG. 6, a second-layer PAA film is formed on the second release film and the inorganic layer in step 607.

Figure 9:
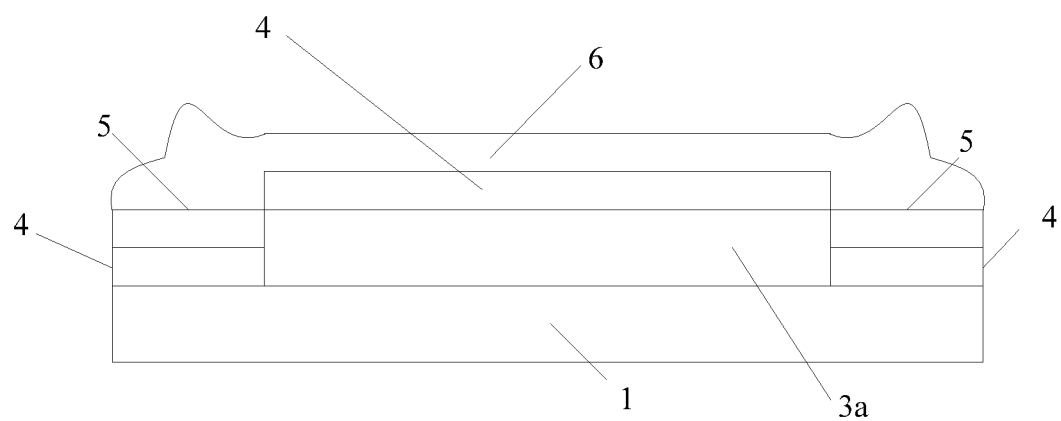
FIG. 9 is a schematic diagram of a structure of a second-layer PAA film formed in the present disclosure.

As shown in FIG. 9, the second-layer PAA film 6 is formed on the second release film 5 and the inorganic layer 4.

The step 607 may include: coating the second release film 5 and the inorganic layer 4 with the PAA film, and drying the PAA film at a high temperature, so as to harden the PAA film to form the second-layer PAA film 6.

Alternatively, a PI coater can be used to coat the second release film and the inorganic layer with the PAA film, and vacuum drying equipment or a hot plate may be used to process the coating PAA film, so as to remove the solution in the PAA film, and form a hardened second-layer PAA film.

As shown again in FIG. 6, the second release film at the edge region and the second-layer PAA film that covers the second release film are stripped to expose the inorganic layer at the edge region in step 608.

Figure 10:
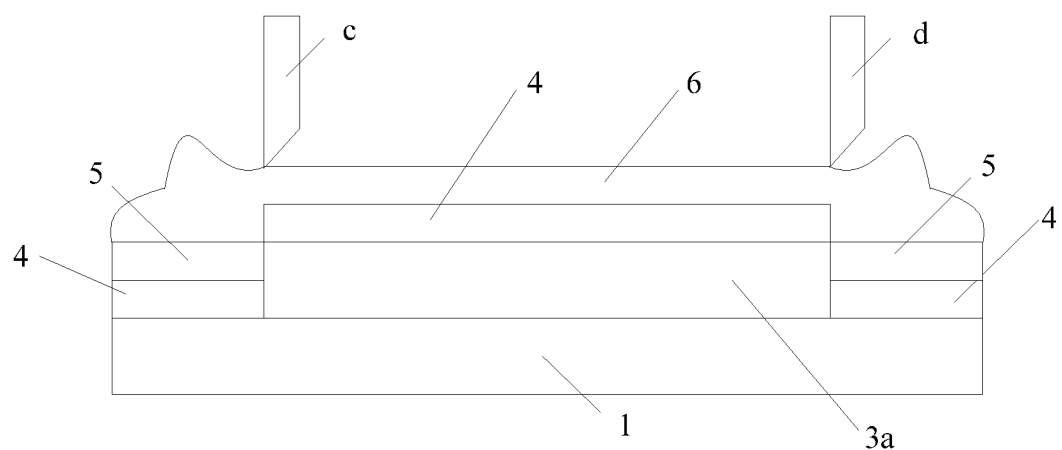
FIG. 10 is a schematic diagram of a structure in which a second-layer PAA film and a second release film at the edge region are stripped according to the present disclosure.

As shown in FIG. 10, the second release film 5 and the second-layer PAA film 6 that covers the second release film 5 are stripped to expose the inorganic layer 4 at the edge region.

For example, a linear cutter may be moved downwards for cutting along an inner edge of the second release film. Then, the second release film and the second-layer PAA film are stripped, such that an region with uneven thicknesses at the edge of PI is stripped, and the substrate at the edge region is exposed. The linear cutter may be a metal wire or the like. Of course, other tools for linear cutting, such as a laser cutting tool, may also be employed.

Exemplarily, as shown in FIG. 10, on completion of the above-described step 607, a cutting removal operation is performed. For example, the linear cutters c and d in FIG. 10 respectively indicate downward movements along the inner edge of the second release film for cutting. After that, the second release film and the second-layer PAA film are stripped, such that the region with the uneven thickness at the edge of PI may be stripped to expose the substrate at the edge region. That is, the second release film and the second-layer PAA film are successfully separated from the substrate.

As shown again in FIG. 6, imidization is performed on the substrate with the edge region exposed and the second-layer PAA film on the substrate to form a PI substrate in step 609.

Figure 11:
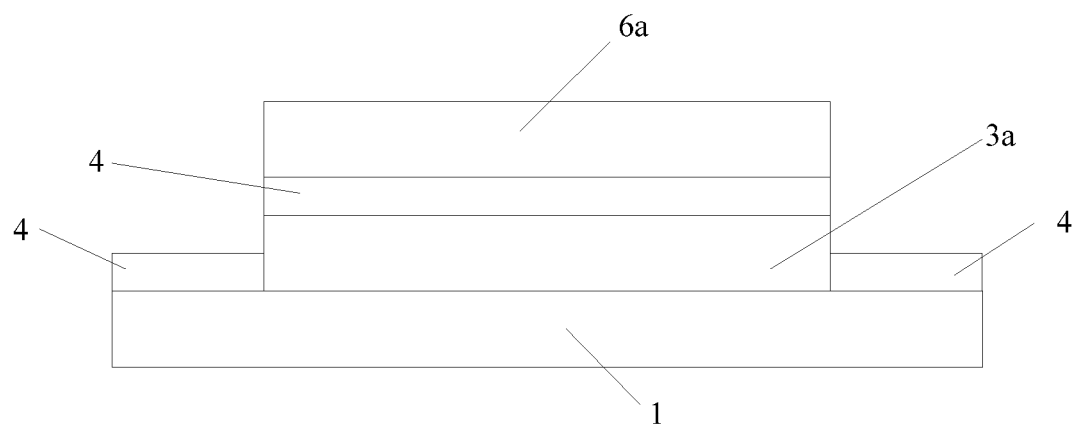
FIG. 11 is a schematic diagram of a structure of another PI substrate provided by the present disclosure.

As shown in FIG. 11, after the imidization, the second-layer PAA film 6 is transformed into a second-layer PI film 6a.

Since the surfaces of the substrate with the edge region exposed and the second-layer PAA film on the substrate are rough, imidization is performed and realized in a way of heating the surfaces of the substrate with the edge region exposed and the second-layer PAA film on the substrate up to 200-500 □, so as to enable the second-layer PAA film to be transformed into the second-layer PI film and then to form the PI substrate.

In the present embodiment, the PI substrate can be formed by forming the first release film at the edge region of the substrate, forming the first-layer PAA film on the first release film and the substrate, stripping the first release film at the edge region and the first-layer PAA film that covers the first release film to expose the edge region of the substrate, and performing the imidization on the substrate with the edge region exposed and the first-layer PAA film on the substrate. Since the first release film and the first-layer PAA film at the edge region are cut and stripped, that is, a region with uneven thicknesses at the edge region of the PI substrate is cut, thus there is no edge region with uneven thicknesses on the formed PI substrate, thereby eliminating the problem of uneven thicknesses of the PI film at the edge region during PI coating, and improving the yield of the PI substrate at the same time.

It should be noted that in the present embodiment, the first release film and the second release film are respectively adopted as a first separable film and a second separable film that are adhered to the edge region of the substrate. In other embodiments, a metal foil may replace the first release film and the second release film and may be adhered to the edge region of the substrate 1 by means of an adhesive material. In order to facilitate a separation of the metal foil from the substrate, the adhesive material may be an adhesive material with a low adhesion force. Meanwhile, the adhesive material is also capable of resisting an erosion of the NMP solvent and to have a heat-resistance stability of 100 □ or above. In addition, since a metal material itself may also be capable of resisting an erosion of the NMP solvent and has a heat-resistance stability of 100 □ or above, the metal foil may also serve as the first separable film.

Moreover, the first separable film and the second separable film may be formed on the substrate by other means, such as coating, sputtering, evaporation and etc., in addition to being adhered onto the substrate, as long as an adhesion force between the first separable film and the substrate is less than an adhesion force between the first separable film and a PI layer, and an adhesion force between the second separable film and the substrate is smaller than an adhesion force between the second separable film and the PI layer.

Referring to FIG. 2, it shows a block diagram of a structure of a PI substrate described in the embodiments of the present disclosure.

The PI substrate in FIG. 2 is formed on a substrate that includes a central region 1a and an edge region 1b. The PI substrate in FIG. 2 includes a first-layer PI film 3a formed at a central region 1a of the substrate 1. Herein, the flatness of the first-layer PI film 3a meets a preset condition.

The preset condition means that the thickness of the first PI film 3a is even. For example, a ratio of a thickness at any point of a film to an average thickness of the entire film is 95%-105%.

Herein, the first-layer PI film 3a may be formed by the method illustrated in FIG. 1.

Referring to FIG. 11, it shows a schematic diagram of a structure of another PI substrate illustrated by an embodiment of the present disclosure.

Compared with the PI substrate shown in FIG. 2, in addition to the first-layer PI film 3a, the PI substrate further includes an inorganic layer 4 and a second-layer PI film 6a. The inorganic layer 4 covers the first-layer PI film 3a. The second-layer PI film 6a is formed on the inorganic layer 4 at the central region 1a of the substrate 1.

The first-layer PI film 3a, the inorganic layer 4 and the second-layer PI film 6a may be formed by the method illustrated in FIG. 6.

It should be noted that in the embodiment illustrated in FIG. 11, the inorganic layer 4 at the edge region 1b of the substrate and the inorganic layer 4 at the central region 1a of the substrate 1 are separated from each other. At this moment, the inorganic layer 4 at the edge region 1b of the substrate 1 does not belong to a portion of the PI substrate, and may be separated from the PI substrate in a process of separating the substrate 1 from the PI substrate. It can be seen that orthographic projections of the first-layer PI film 3a and the second-layer PI film 6a on the substrate 1 coincide. An orthographic projection of the first-layer PI film 3a on the substrate 1 coincides with an orthographic projection of the inorganic layer 4 on the substrate 1, or, an orthographic projection of the first-layer PI film 3a on the substrate 1 is within an orthographic projection of the inorganic layer 4 on the substrate 1.

In an embodiment of the present disclosure, the PI substrate is configured to be carried on the substrate 1, so as to facilitate the storage and transport of the PI substrate, as well as a preparation processes of subsequent devices. After preparation of the subsequent devices, the substrate 1 may be separated from the PI substrate.

In the present embodiment, the PI substrate can be formed by forming the first release film at the edge region of the substrate, forming the first-layer PAA film on the first release film and the substrate, stripping the first release film at the edge region and the first-layer PAA film that covers the first release film to expose the edge region of the substrate, and performing the imidization on the substrate with the edge region exposed and the first-layer PAA film on the substrate. Since the first release film and the first-layer PAA film at the edge region are cut and stripped, that is, a region with uneven thicknesses at the edge region of the PI substrate is cut, thus there is no edge region with uneven thicknesses on the formed PI substrate, thereby eliminating the problem of uneven thicknesses of the PI film at the edge region during PI coating, and improving the yield of the PI substrate at the same time.

The present disclosure further discloses a display device, including the PI substrate in the embodiment illustrated by FIG. 2 or FIG. 11.

It should be noted that the display device in the embodiment may be a mobile phone, a tablet computer, a television, a laptop, a digital photo frame, a navigator or any other products or components with a display function.

The display device has all advantages of the PI substrate in the embodiment illustrated by FIG. 2 or FIG. 11, which are not repeated herein.

It should be noted that the above-mentioned method embodiments are expressed as a series of motion combinations for brief description. However, those skilled in the art should know that the present disclosure is not limited by the described order of the motions since some steps may be performed in other orders or simultaneously according to the present disclosure. Besides, those skilled in the art also should know that the embodiments described in the description are all optional embodiments, and the motions involved therein are not necessarily required by the present disclosure.

The above-described device embodiments are briefly described since they are basically similar to the method embodiments, and the related parts may be referred to the description of the method embodiments.

The embodiment in the specification are described in a progressive manner, and each embodiment focuses on the difference from other embodiments, and the same or similar parts among the embodiments may be referred to each other.

Those skilled in the art may readily conceive that any combination of the above embodiments is feasible, so any combination of the above embodiments is an embodiment of the present disclosure, but due to the space limitation, the combination is not detailed here.

It should be noted that, relation terms such as first and second, etc. in the context are only used to distinguish an entity or operation from another entity or operation, and do not necessarily require or imply any such actual relationship or order among the entities or operations. Moreover, the terms "include" and "comprise" not only include these elements but also other elements that are not specifically listed or the elements that are inherent to such processes, methods, articles, or devices. In the case of no more limitation, an element defined by a sentence "include . . . " does not exclude the case that same elements, in addition to the element, also exist in a process, a method, an article, or a device.

Although optional embodiments of the present disclosure have been described, those skilled in the art may make additional changes and modifications to these embodiments once they learn the basic inventive concept. Therefore, the appended claims are intended to be interpreted as including the optional embodiments and all changes and modifications that fall within the scope of the present disclosure.

The PI substrate and the preparation method thereof, and the display device provided by the present disclosure are described in detail. Specific examples are used herein to describe the principles and implementations of the present disclosure. Description of the above embodiments are merely used to help understanding the methods and core concepts of the present disclosure. At the same time, those skilled in the art, based on the concepts of the present disclosure, may change the specific implementation manners and application scopes. In summary, the contents of the specification should not be construed as a limitation to the present disclosure.

What is claimed is:

1. A method for preparing a PI substrate, comprising:
   forming a first separable film at an edge region of a substrate;
   forming a first-layer polyamic acid (PAA) film on the first separable film and the substrate;
   stripping the first separable film and the first-layer PAA film that covers the first separable film to expose the edge region of the substrate;
   performing imidization on the first-layer PAA film on the substrate with the edge region exposed, to enable the first-layer PAA film to be transformed into a first-layer PI film;
   forming an inorganic layer at the edge region of the substrate and the first-layer PI film;
   forming a second separable film at the edge region;
   forming a second-layer PAA film on the second separable film and the inorganic layer;
   stripping the second separable film at the edge region and the second-layer PAA film that covers the second separable film to expose the substrate at the edge region; and
   performing imidization on the second-layer PAA film on the substrate with the edge region exposed, to enable the second-layer PAA film to be transformed into a second-layer PI film.

2. The method according to claim 1, wherein both a thickness of the second separable film and a thickness of the inorganic layer are half of a thickness of the first-layer PI film.

3. The method according to claim 1, wherein the forming the first-layer PAA film on the first separable film and the substrate comprises:
   coating the first separable film and the substrate with a PAA film; and
   drying the PAA film at a high temperature, to enable the PAA film to be hardened to form the first-layer PAA film.

4. The method according to claim 1, wherein a width of the first separable film is 5 mm to 20 mm.

5. The method according to claim 4, wherein a width of the first separable film is 10 mm.

6. The method according to claim 1, wherein the first separable film comprises at least one of a metal foil and a release film.

7. The method according to claim 6, wherein a material of the release film comprises at least one of polyimide and polypropylene.

8. A method for preparing a PI substrate, comprising:
   forming a first separable film at an edge region of a substrate;
   forming a first-layer PI film on the first separable film and the substrate; and
   stripping the first separable film and the first-layer PI film that covers the first separable film to expose the edge region of the substrate;

forming an inorganic layer at the edge region of the substrate and the first-layer PI film;

forming a second separable film at the edge region;

forming a second-layer PI film on the second separable film and the inorganic layer; and stripping the second separable film at the edge region and the second-layer PI film that covers the second separable film to expose the edge region of the substrate.

9. The method according to claim 8, wherein both a thickness of the second separable film and a thickness of the inorganic layer are half of a thickness of the first-layer PI film.

10. The method according to claim 8, wherein the forming the first-layer PI film on the first separable film and the substrate comprises:

coating the first separable film and the substrate with a PI film; and drying the PI film at a high temperature, to enable the PI film to be hardened to form the first-layer PI film.

11. The method according to claim 8, wherein a width of the first separable film is 5 mm to 20 mm.

12. The method according to claim 11, wherein a width of the first separable film is 10 mm.

13. The method according to claim 8, wherein the first separable film comprises at least one of a metal foil and a release film.

14. The method according to claim 13, wherein a material of the release film comprises at least one of polyimide and polypropylene.

\* \* \* \* \*